United States Patent
Hyun

[11] Patent Number: 5,963,797
[45] Date of Patent: Oct. 5, 1999

[54] METHOD OF MANUFACTURING SEMICONDUCTOR DEVICES

[75] Inventor: Lyu Ki Hyun, Lyojin, Rep. of Korea

[73] Assignee: LG Electronics Inc., Seoul, Rep. of Korea

[21] Appl. No.: 09/086,527

[22] Filed: May 29, 1998

Related U.S. Application Data

[62] Division of application No. 08/792,377, Feb. 3, 1997, Pat. No. 5,814,836.

[30] Foreign Application Priority Data

Apr. 9, 1996 [KR] Rep. of Korea .................. 96-10638

[51] Int. Cl.$^6$ .................................................. H01L 21/331
[52] U.S. Cl. .......................... 438/149; 438/158; 438/159; 438/160; 438/30
[58] Field of Search .............................. 438/30, 158, 159, 438/149, 160

[56] References Cited

U.S. PATENT DOCUMENTS

| | | | |
|---|---|---|---|
| 4,933,296 | 6/1990 | Parks et al. | 438/30 |
| 5,137,841 | 8/1992 | Takeda et al. | 438/30 |
| 5,512,778 | 4/1996 | Chung et al. | 257/774 |
| 5,527,726 | 6/1996 | Possin et al. | 438/159 |
| 5,532,180 | 7/1996 | Den Boer et al. | 438/30 |
| 5,539,219 | 7/1996 | Den Boer et al. | 438/159 |

*Primary Examiner*—Peter Toby Brown
*Assistant Examiner*—Maria Guerrero
*Attorney, Agent, or Firm*—Finnegan, Henderson, Farabow, Garrett & Dunner, L.L.P.

[57] ABSTRACT

The present invention relates to a method for manufacturing TFTs in which a gate electrode is first formed on a transparent glass substrate by depositing and patterning a first metal layer. Next, a first insulating layer, a semiconductor layer, impurity-containing semiconductor layer and a second insulating layer are deposited over the first metal layer and the substrate surface. The insulating layer is patterned followed by deposition of a second metal layer. First portions of the second metal layer and the impurity-containing semiconductor layer along with part of the second insulating layer are etched over the gate electrode (thereby forming source and drain electrodes) at the same time second portions of the second metal layer and impurity-containing semiconductor layer and portions of the semiconductor layer laterally spaced from the gate electrode are etched. As a result, the number of etching steps is reduced, and the second insulating layer controls the etching speed.

11 Claims, 6 Drawing Sheets

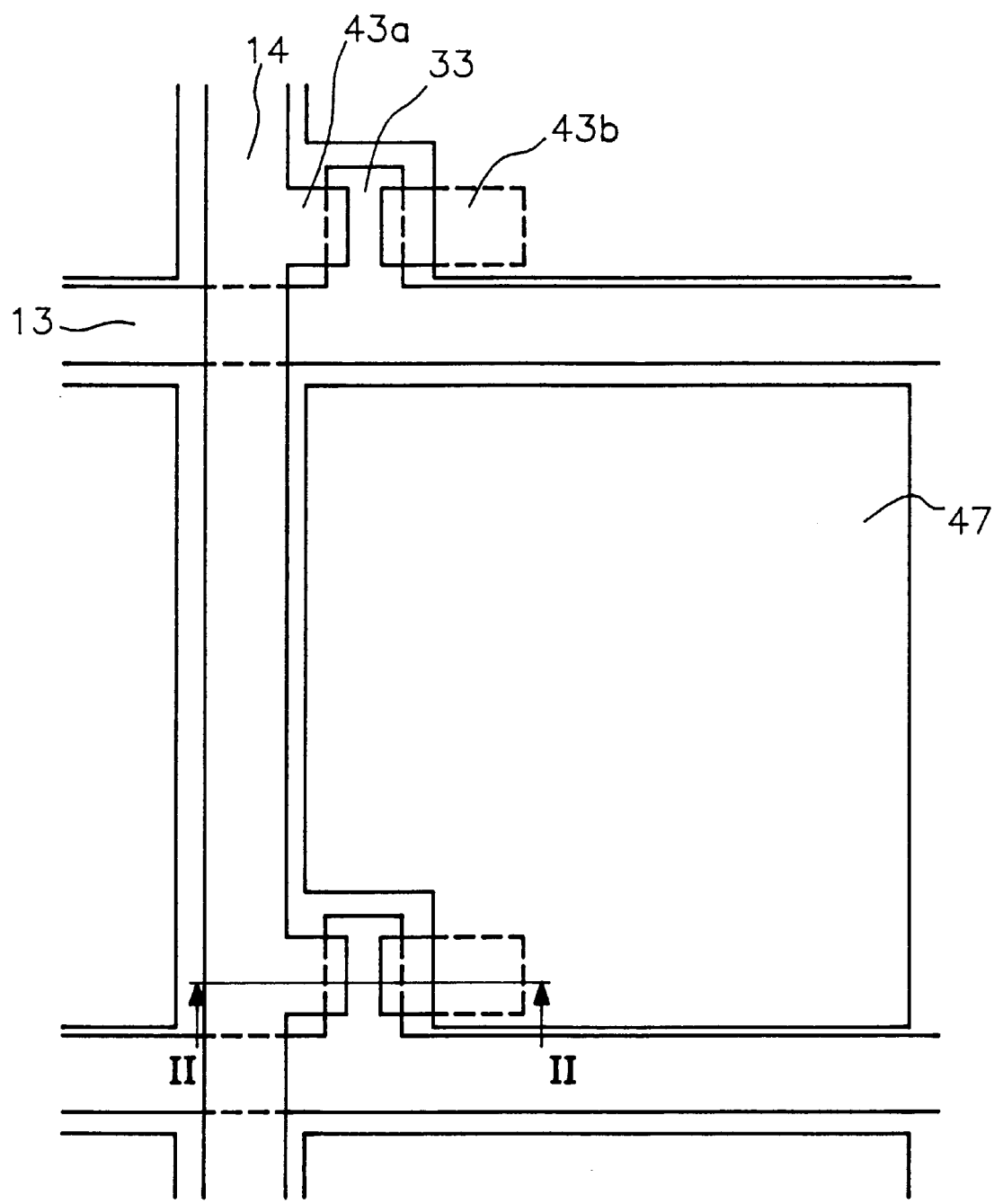

METHOD OF MANUFACTURING SEMICONDUCTOR DEVICES

This is a Divisional of application Ser. No. 08/792,377, filed on Feb. 3, 1997 now U.S. Pat. No. 5,814,836.

BACKGROUND OF THE INVENTION

1. Field of the Invention

The present invention is directed to a method for manufacturing and related structure of thin film transistors ("TFT"s) for use in an active matrix liquid crystal display ("AMLCD"s).

2. Description of the Related Art

AMLCDs include switching devices, such as integrated TFT active elements for driving and/or controlling each pixel.

As shown in FIG. 1A, in a conventional LCD having an integrated TFT array, substantially rectangular pixel electrodes 47 are closely arranged in rows and columns on a transparent glass substrate. Each of a plurality of gate bus lines (address lines) 13 is provided between respective rows of the pixel electrodes 47, and each of a plurality of source bus lines (data lines) 14 is provided between columns of pixel electrodes 47.

FIG. 1B illustrates an enlarged plan view of an individual pixel of the LCD. The pixel includes a TFT having a gate electrode 33, protruding from a gate bus line 13, formed on a transparent glass substrate. An insulating layer covers the gate electrode, upon which source bus lines 14 are oriented perpendicular to the gate bus lines. A semiconductor layer is formed on the insulating layer covering the gate bus line and the gate electrode adjacent respective intersections of the gate bus lines 13 and the source bus lines 14. Opposing source and drain electrodes are provided on each semiconductor layer, thereby completing the TFT active elements.

A process for manufacturing a conventional LCD is described below with reference to FIGS. 2A to 2E, which show cross-sectional views taken along a line 2—2 of FIG. 1B during the manufacturing process.

A gate electrode 33 is first formed on a transparent glass substrate 31 by depositing and patterning a first metal layer (FIG. 2A). A first insulating layer (gate insulating layer) 35 made of SiNx, an a-Si semiconductor layer 37 and a second SiNx insulating layer are then successively deposited on the entire surface of the substrate. An etch-stopper 40 is next formed by patterning the second insulating layer (FIG. 2B), followed by deposition of an n$^+$ a-Si impurity doped semiconductor layer 39 on the entire surface of the substrate. Semiconductor layer 37 is then patterned together with the n+semiconductor layer 39 (FIG. 2C).

Next, a second metal layer 43 is sputtered on the entire surface of the substrate and source and drain electrodes 43a and 43b are formed by patterning the second metal layer. The portion of the n$^+$ semiconductor layer 39 which is not covered by the source and drain electrodes is then etched by using the source and drain electrodes as a mask (FIG. 2D).

After forming the source and drain electrodes, insulating passivation layer 45 is formed by depositing a silicon nitride layer on the substrate, and a contact hole is formed in the insulating passivation layer overlying the drain electrode. An ITO layer is sputtered on the substrate surface and a pixel electrode 47 is formed by patterning the ITO layer, such that the pixel electrode 47 electrically contacts the drain electrode 43b (see FIG. 2E).

The TFT manufactured by the conventional method described above is known as an etch-stop type. Preferably, the portion of the semiconductor layer 39 not covered by the source and drain electrodes should be completely etched. Accordingly, the etching should continue for a considerable time. Thus, the etch-stop 40 is included to prevent the semiconductor layer 37 from being over-etched. However, including the etch stop adds an additional mask step, which can reduce yield. In particular, this additional step is complicated and requires specific exposure times and temperatures, as well as photoresist development and baking. If these parameters are not precisely controlled, yield can suffer. Therefore, the number of mask steps should preferably be reduced.

SUMMARY OF THE INVENTION

An object of the present invention is to provide a method for manufacturing TFTs and a related structure, in which source and drain electrodes, a semiconductor layer and an impurity-containing semiconductor layer are etched simultaneously using a single mask. Another object is to provide a method for manufacturing TFTs comprising an insulating layer which can control the amount of etching.

In order to achieve these objectives, the method for manufacturing TFTs according to the present invention is described as follows. A first metal layer is deposited on a transparent glass substrate and a gate electrode is formed by patterning the first metal layer. A first insulating layer, a semiconductor layer, an impurity-containing semiconductor layer and a second insulating layer are successively deposited on the gate electrodes and the transparent glass substrate. The second insulating layer is patterned into an island by etching a portion of the second insulating layer. A second metal layer is then deposited on the island-shaped second insulating layer and the impurity-containing semiconductor layer. In a single step, the second metal layer, impurity-containing semiconductor layer and semiconductor layer are etched, and source and drain electrodes are formed by etching a portion of the second metal layer, second insulating layer and impurity-containing semiconductor layer. An insulating passivation layer having a contact hole is formed on the source and drain electrodes, the semiconductor layer and the first insulating layer. A transparent electrode is formed on a portion of the insulating passivation layer by depositing and patterning a transparent metal layer, the transparent electrode being electrically connected with the drain electrode.

A TFT according to the present invention comprises a transparent glass substrate ; a gate electrode formed on the transparent glass substrate ; a first insulating layer covering the gate electrode and the transparent glass substrate ; a semiconductor layer formed on the first insulating layer; an impurity-containing semiconductor layer formed on the semiconductor layer, the impurity-containing semiconductor layer being separated into two parts ; second insulating layers formed on each part of the separated impurity-containing semiconductor layers ; source and drain electrodes formed on both parts of the impurity-containing semiconductor layer and the second insulating layers, respectively ; an insulating passivation layer with a contact hole formed on the source and drain electrodes, the semiconductor layer and the first insulating layer; and a transparent electrode formed on a portion of the insulating passivation layer, the transparent electrode being electrically connected with the drain electrode through the contact hole.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIG. 1B is an enlarged plan view showing a single liquid crystal display elements of the circuit diagram of FIG. 1A;

DETAILED DESCRIPTION OF THE PREFERRED EMBODIMENT

Reference will now be made in detail to the present preferred embodiments of the invention, examples of which are illustrated in the accompanying drawings. Wherever possible, the same reference numbers will be used throughout the drawings to refer to the same or like parts.

The method for manufacturing the TFTs according to the present invention will now be described below with reference to FIGS. 3A to 3G.

Figure 3A:
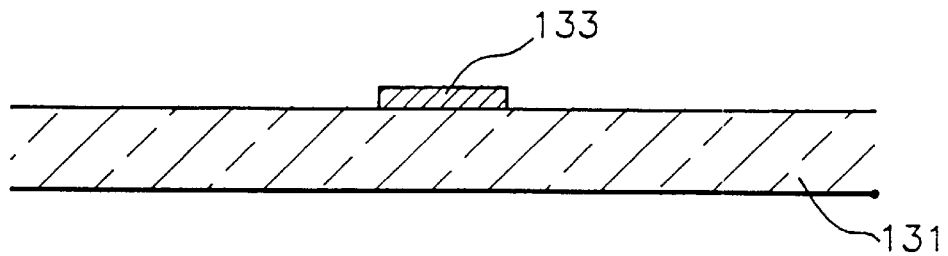
FIGS. 3A to 3G illustrate various steps for manufacturing TFTs of an LCD in accordance with the present invention.

As shown in FIG. 3A, a first metal layer made of Al or Al alloy such as Al—Pd, Al—Si, Al—Si—Ti, Al—Si—Cu, etc., is sputtered onto a transparent glass substrate 131. Gate electrodes are then formed by selectively etching the first metal layer using a photolithography; one being indicated at 133 in FIG. 3A.

To improve chemical-resistance, heat-resistance and adhesiveness of the first Al layer, an anodized layer can be formed on the gate electrode 133 by anodizing the gate electrode 133. The anodized layer in combination with a Si-nitride gate insulating layer formed during at the next step function as a single insulating layer and therefore effectively insulate the gate electrode 133 from the signal lines.

Figure 3B:
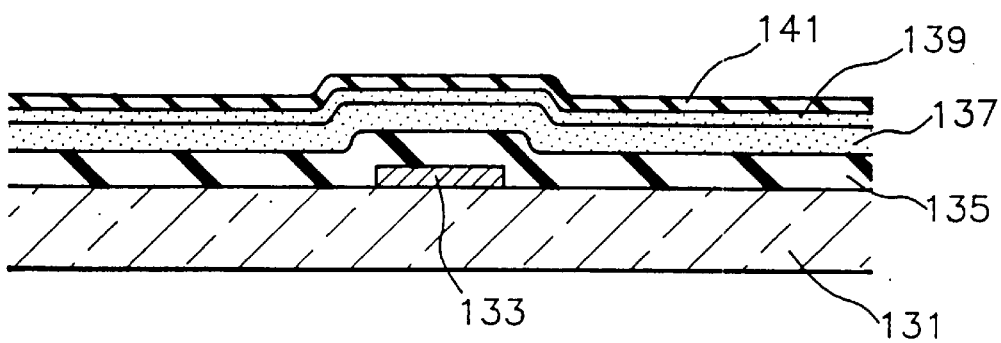

As seen in FIG. 3B, a first insulating layer (gate insulating layer) 135 made of Si-nitride, a-Si semiconductor layer 137, an impurity-containing a-Si semiconductor layer 139 made of a-Si and a second Si-nitride insulating layer 141 are successively deposited on the transparent glass substrate 131 over gate electrode 133. Preferably, these layers are formed by reacting appropriate combinations of ammonia, silane, nitrogen and phosphine gases in a plasma CVD reactor.

Figure 3C:
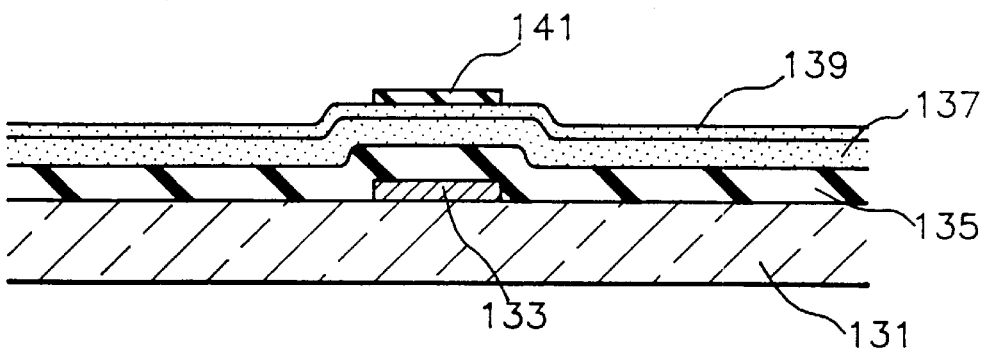

As shown in FIG. 3C, the second insulating layer 141 is patterned into an island shape as follows: a photo-sensitive film is coated onto the second insulating layer; the photo-sensitive film is exposed using a back exposure technique with gate electrode 133 serving as a mask; developing the photosensitive layer to remove the exposed portions thereof; and etching the second insulating layer in regions not covered by the photosensitive layer.

Figure 3D:
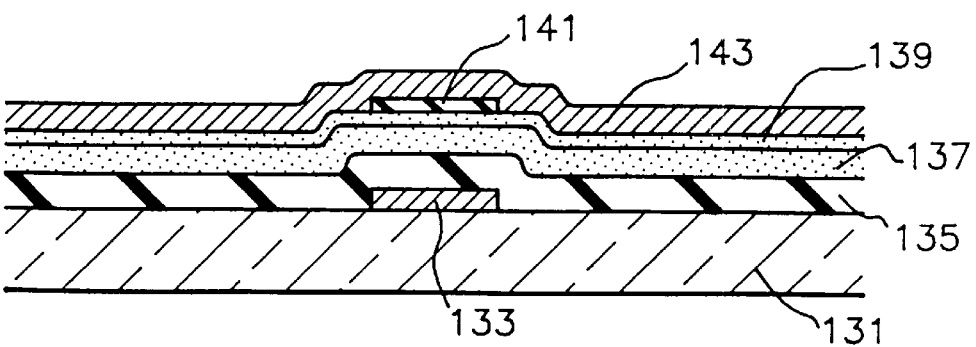
Figure 3E:
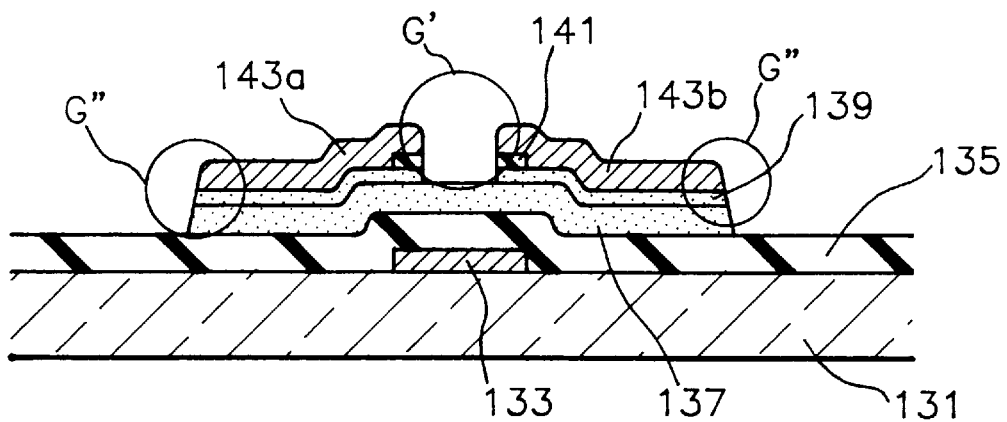

A second metal layer 143 comprising one of Al—Pd, Al—Si, Al—Si—Ti, Al—Si—Cu, etc., is then sputtered onto the substrate, as shown in FIG. 3D.

A photoresist layer (not shown), patterned by a photolithography technique, is formed on second metal layer 143. Using the patterned photoresist layer as a mask, portions (i.e., region G' in FIG. 3E) of the second metal layer 143, second insulating layer 141 and impurity-containing semiconductor layer 139 overlying gate electrode 133 are successively etched in a single step. At the same time, portions of the second metal layer 143, impurity-containing semiconductor layer 139 and semiconductor layer 137 not overlying gate electrode 133 but laterally spaced from the gate electrode and second insulating layer 141 (i.e., regions G") are successively etched in the same step.

Figure 1A:
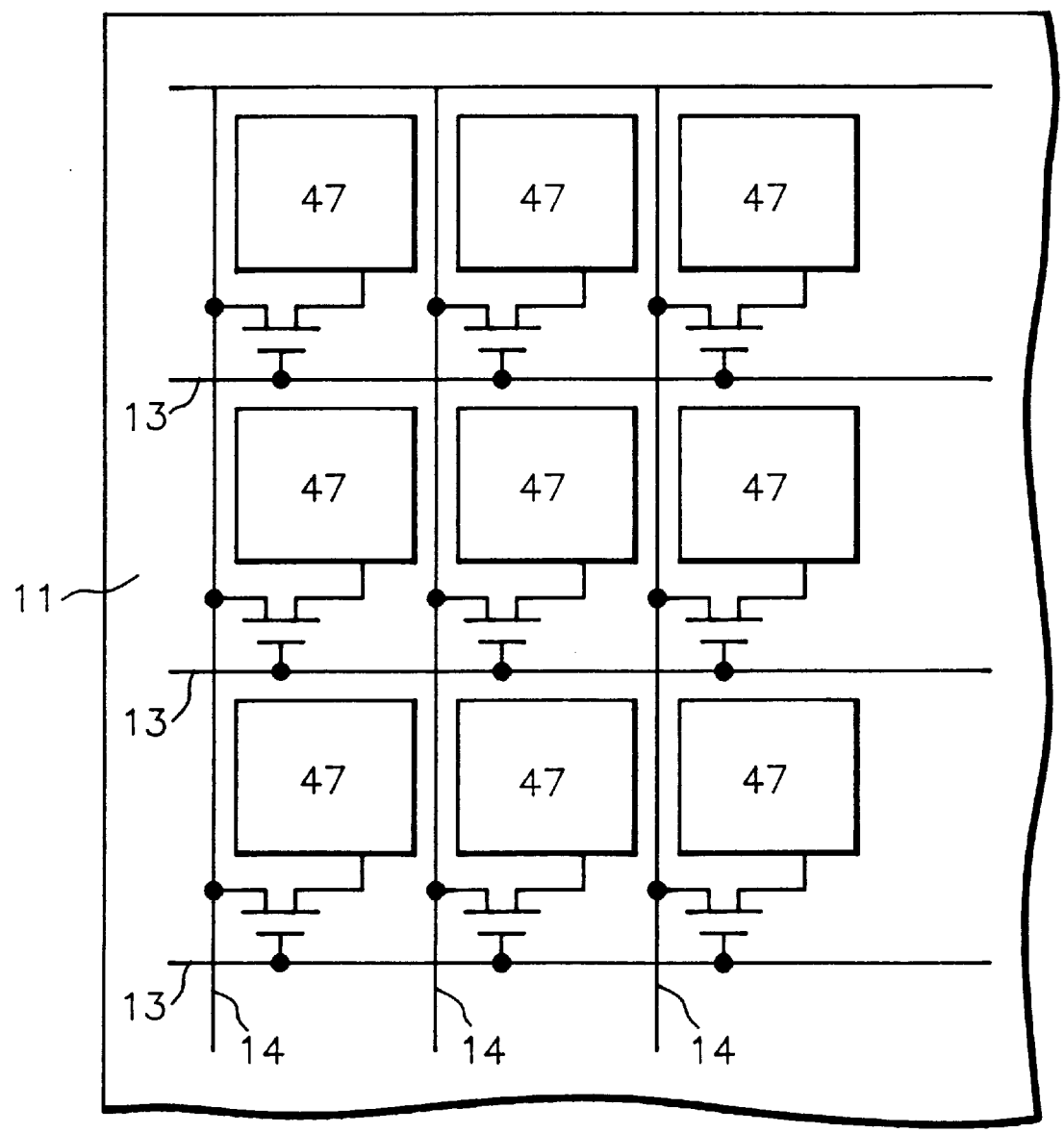
FIG. 1A is a circuit diagram showing a conventional LCD.
Figure 2A:
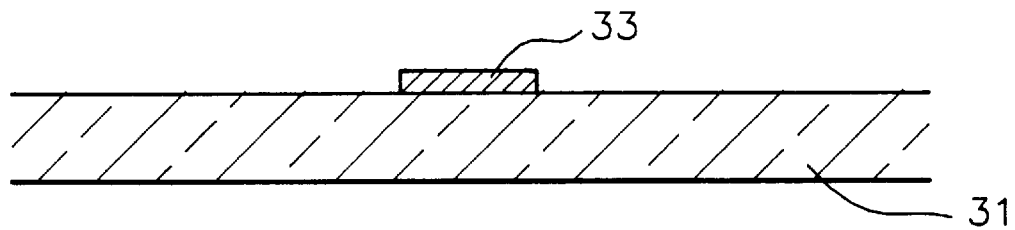
FIGS. 2A to 2E illustrate a process for manufacturing the TFTs included in the circuit diagram of FIG. 1A.
Figure 2B:
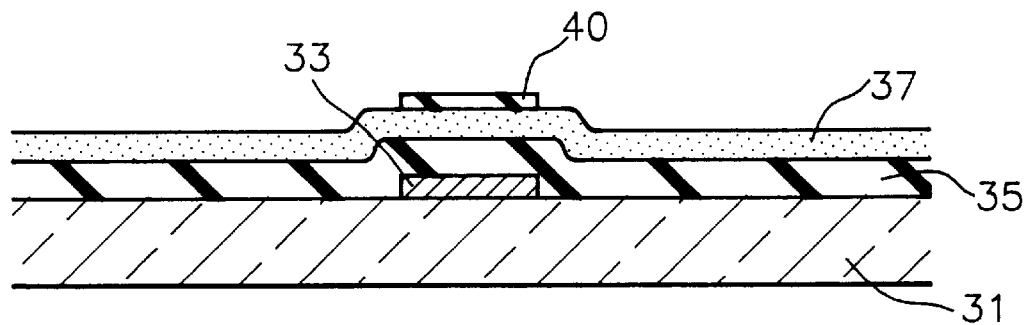
Figure 2C:
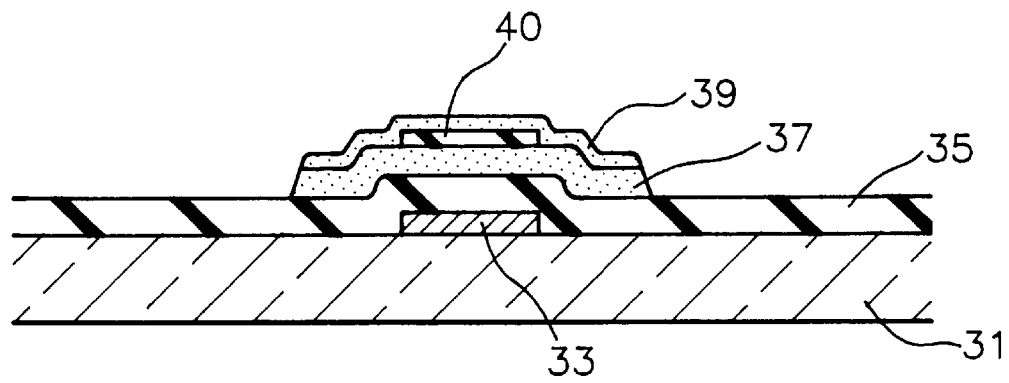
Figure 2D:
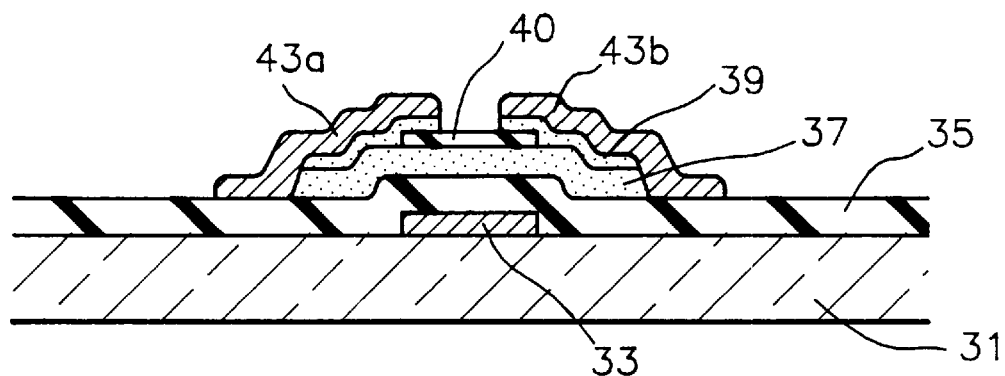
Figure 2E:
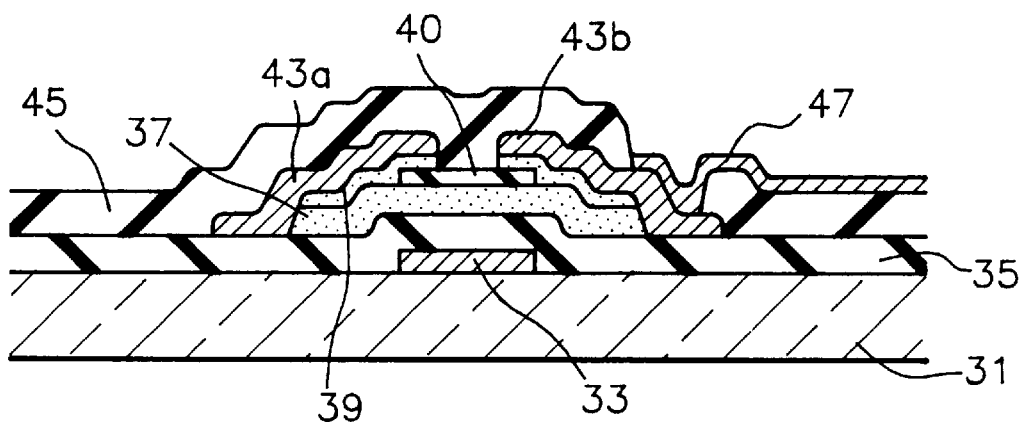

In contrast, in the conventional method for forming a TFT described in conjunction with FIGS. 2A–2E, portions of semiconductor layer 37 and impurity containing semiconductor layer 39 not overlying gate electrode 33 FIG. 2C) are etched in a separate step from the source drain electrode etching step (FIG. 2D). Thus, an advantage achieved by the present intention is that these two steps are effectively combined into a single etching step, thereby reducing the total number of mask steps, improving yield and simplifying the overall manufacturing process.

The compositions and thicknesses of the second insulating layer 141 and the semiconductor layer 137 are different. Therefore, the speed and degree of etching in region G' is different from those of region G".

Accordingly, the second insulating layer 141 controls the etch rate, and thus, the amount of etching. For example, the second insulating layer 141 and the semiconductor layer 137 can have the same thickness because they are respectively made of materials having the same etching selective ratio. However, when the source electrode 143a, the drain electrode 143b, the impurity-containing semiconductor layer 139 and the semiconductor layer 137 are patterned into a desired shape using an etchant, it is preferable to form the second insulating layer 141 slightly thinner than the semiconductor layer 137 so that the portion of the impurity-containing semiconductor layer to be removed can be completely etched.

Figure 3F:
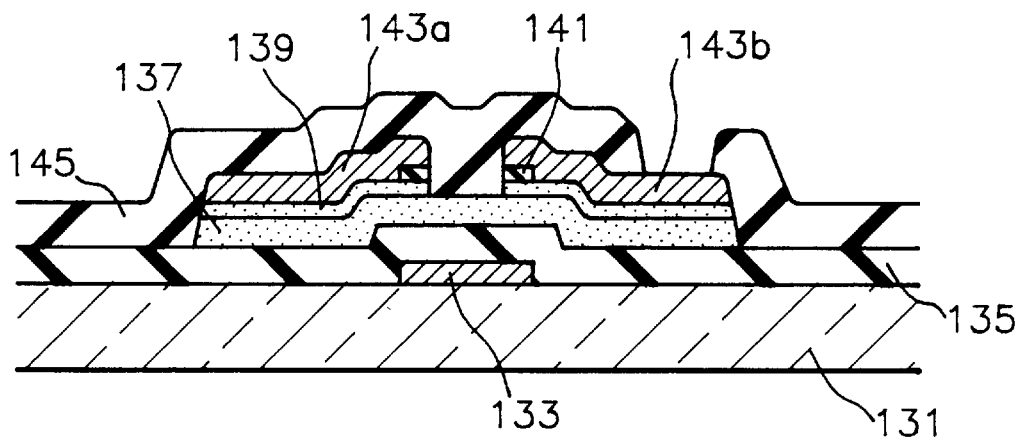
Figure 3G:
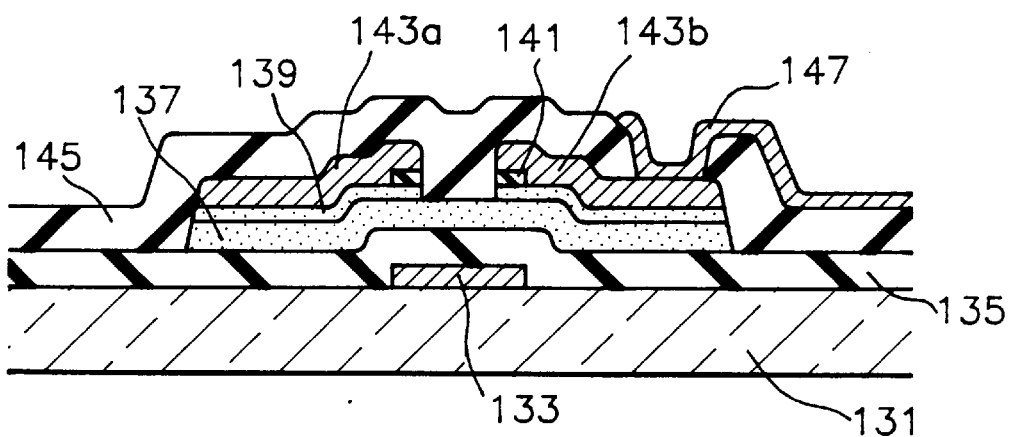

As shown in FIG. 3F, an insulating passivation layer 145 having a contact hole is formed by depositing a Si-nitride layer preferably reacted with ammonia gas, silane gas and nitrogen gas in the plasma CVD reactor. Then, a transparent electrode 147 is electrically connected with the drain electrode through the contact hole by depositing a transparent metal layer into the contact hole.

The TFT manufactured in accordance with the above-described method has the following structure. Gate electrode 133 is formed on the transparent glass substrate and covered by a gate insulating layer 135. Semiconductor layer 137 is formed on the gate insulating layer 135, and impurity-containing semiconductor layer 139 is provided on the semiconductor layer 137, including two spaced portions with a gap therebetween. Thus a portion of the semiconductor layer is exposed by the gap.

Second insulating layer 141 is formed on respective portions of the spaced impurity-containing semiconductor. Source and drain electrodes are respectively formed on the two portions of the impurity-containing semiconductor layer 139 and the second insulating layers 141. A passivation layer covers the source and drain electrodes 143a and 143b, gate insulating layer 135 and a portion of the semiconductor layer which is not covered by the impurity-containing semiconductor layer 139, the second insulating layer 141 and the source and drain electrodes. Further, a contact hole is formed in the passivation layer in order to electrically contact transparent electrode 147 to drain electrode 143b.

According to the present invention, the manufacturing process can be simplified and the manufacturing cost can be saved because the number of masking steps is reduced by etching the metal layer, the second insulating layer, the impurity-containing semiconductor layer and the semiconductor layer in a single step because the second insulating layer functions to control etch rate.

It will be apparent to those skilled in the art that various modifications and variations can be made in the TFT and related manufacturing method of the present invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing a semiconductor device, comprising the steps of:

depositing a first semiconductor layer on a substrate;

depositing a second semiconductor layer on said first semiconductor layer;

depositing an insulating layer on said second semiconductor layer;

patterning said insulating layer;

depositing a conductive layer on said patterned insulating layer; and in a single step, etching a portion of said conductive layer and etching a portion of said second semiconductor layer through said patterned insulating layer.

2. A method in accordance with claim 1, wherein during said single etching step, other portions of said conductive and second semiconductor layers are etched, as well as a portion of said first semiconductor layer, said other portions of said conductive and second semiconductor layers, and said portion of said first semiconductor layer being laterally spaced from a location of said patterned insulating layer.

3. A method in accordance with claim 1, wherein after said single etching step, conductive layer is divided into first and second parts, said method further comprising the steps of::

depositing a passivation layer on said first and second parts of said conductive layer;

and selectively etching a portion of said passivation layer to form a contact hole over said first conductive layer part.

4. A method in accordance with claim 3, further comprising the steps of:

depositing a transparent conductive layer on said etched passivation layer and in said contact hole; and patterning said transparent conductive layer to form an electrode electrically coupled with said first conductive layer part.

5. A method in accordance with claim 1, wherein said insulative layer is a second insulative layer, and prior to said first semiconductor layer depositing step, said method further comprising the steps of:

depositing a gate electrode on said substrate and depositing a first insulating layer on said gate electrode.

6. A method in accordance with claim 1, wherein said substrate includes glass.

7. A method in accordance with claim, 3 wherein said first and second conductive layer parts are source and drain electrodes, respectively, of said semiconductor device.

8. A method in accordance with claim 1, further comprising the step of incorporating dopant impurities into said second semiconductor layer.

9. A method for manufacturing a thin-film-transistor, comprising the steps of:

depositing a first conductive layer on a substrate;

patterning said first conductive layer to form a gate electrode;

depositing a first insulating layer on said substrate;

depositing a semiconductor layer on said first insulating layer;

depositing a doped semiconductor layer on said semiconductor layer;

depositing a second insulating layer on said doped semiconductor layer;

patterning said second insulating layer to form an island in correspondence with said gate electrode;

depositing a second conductive layer on said island and said doped semiconductor layer;

in a single step, removing first portions of said second metal layer, said doped semiconductor layer and said island to form first and second terminals of thin-film-transistor and exposing a first portion of said semiconductor layer, and removing second portions of said second conductive layer, said doped semiconductor layer and said semiconductor layer;

depositing a passivation layer on said source drain electrodes, said first portion of said semiconductor layer, and said first insulating layer;

removing a portion of said passivation layer overlying said first terminal to expose a portion of said first terminal;

depositing a transparent conductive layer on said passivation layer and on said exposed portion of said first terminal; and patterning said transparent conductive layer to form an electrode electrically connected to said first terminal.

10. A method in accordance with claim 9, wherein said substrate includes glass.

11. A method in accordance with claim 9, wherein said first and second terminals constitute drain and source electrodes, respectively, of said thin-film-transistor.

* * * * *

UNITED STATES PATENT AND TRADEMARK OFFICE
CERTIFICATE OF CORRECTION

PATENT NO. : 5,963,797
DATED : October 5, 1999
INVENTOR(S) : Ki-Hyun LYU

It is certified that error appears in the above-identified patent and that said Letters Patent is hereby corrected as shown below:

Claim 2, col. 5, line 27, delete "single".
Claim 3, col. 5, line 34, delete "single".
Claim 8, col. 6, line 10, delete "layer".
Claim 9, col. 6, line 30, "metal" should read -- conductive --.

Signed and Sealed this

Fifteenth Day of May, 2001

*Attest:*

NICHOLAS P. GODICI

*Attesting Officer*     *Acting Director of the United States Patent and Trademark Office*